United States Patent
Lee et al.

(10) Patent No.: US 8,652,899 B2
(45) Date of Patent: Feb. 18, 2014

(54) METHOD OF FABRICATING PIXEL STRUCTURE

(71) Applicant: AU Optronics Corp., Hsin-Chu (TW)

(72) Inventors: Chien-Chih Lee, Hsin-Chu (TW);
Pei-Yi Shen, Hsin-Chu (TW);
Ching-Yang Cheng, Hsin-Chu (TW);
Shu-Ming Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/967,338

(22) Filed: Aug. 14, 2013

(65) Prior Publication Data
US 2013/0323889 A1    Dec. 5, 2013

Related U.S. Application Data (62) Division of application No. 13/461,798, filed on May 2, 2012.

(30) Foreign Application Priority Data

Jul. 13, 2011 (TW) .............................. 100124773 A (51) Int. Cl.
*H01L 29/04* (2006.01)
(52) U.S. Cl.
USPC ...... 438/239; 438/149; 257/59; 257/E33.062; 349/139
(58) Field of Classification Search
USPC ..................... 257/59, 60, 66, 68, 72, E33.062, 257/E33.652; 349/38, 42, 43, 139; 438/149, 438/210, 238, 239
See application file for complete search history.

(56) References Cited

U.S. PATENT DOCUMENTS

| | | | |
|---|---|---|---|
| 7,768,015 B2 * | 8/2010 | Huang et al. | 257/72 |
| 7,812,352 B2 * | 10/2010 | Chien et al. | 257/72 |
| 7,875,889 B2 * | 1/2011 | Choi et al. | 257/72 |
| 2006/0119753 A1 | 6/2006 | Luo | |
| 2008/0296581 A1 | 12/2008 | Chao | |
| 2009/0289259 A1 | 11/2009 | Huang | |

FOREIGN PATENT DOCUMENTS

| | | |
|---|---|---|
| CN | 1560687 A | 1/2005 |
| CN | 1680861 A | 10/2005 |
| CN | 101075623 A | 11/2007 |
| CN | 101295721 A | 10/2008 |

* cited by examiner

*Primary Examiner* — Matthew E Warren
(74) *Attorney, Agent, or Firm* — Winston Hsu; Scott Margo (57) ABSTRACT

The present invention provides a pixel structure including a substrate, a patterned electrode disposed on the substrate, a first insulating layer disposed on the patterned electrode, a common electrode disposed on the first insulating layer, a second insulating layer disposed on the common electrode, and a drain disposed on the second insulating layer. The first insulating layer has a first through hole, and the second insulating layer has a second through hole. The drain includes a first portion electrically connected to the patterned electrode via the first through hole and the second through hole, and a second portion extending onto the common electrode. The common electrode is coupled with the patterned electrode to form a first storage capacitor and is coupled with the second portion to form a second storage capacitor.

7 Claims, 11 Drawing Sheets

METHOD OF FABRICATING PIXEL STRUCTURE

CROSS REFERENCE TO RELATED APPLICATIONS

This application is a divisional application of and claims the benefit of U.S. patent application Ser. No. 13/461,798, filed May 2, 2012.

BACKGROUND OF THE INVENTION

1. Field of the Invention

The present invention relates to a pixel structure and a method of fabricating the same, and more particularly, to a pixel structure having two storage capacitors formed by three electrodes and a method of fabricating the same.

2. Description of the Prior Art

Figure 1:
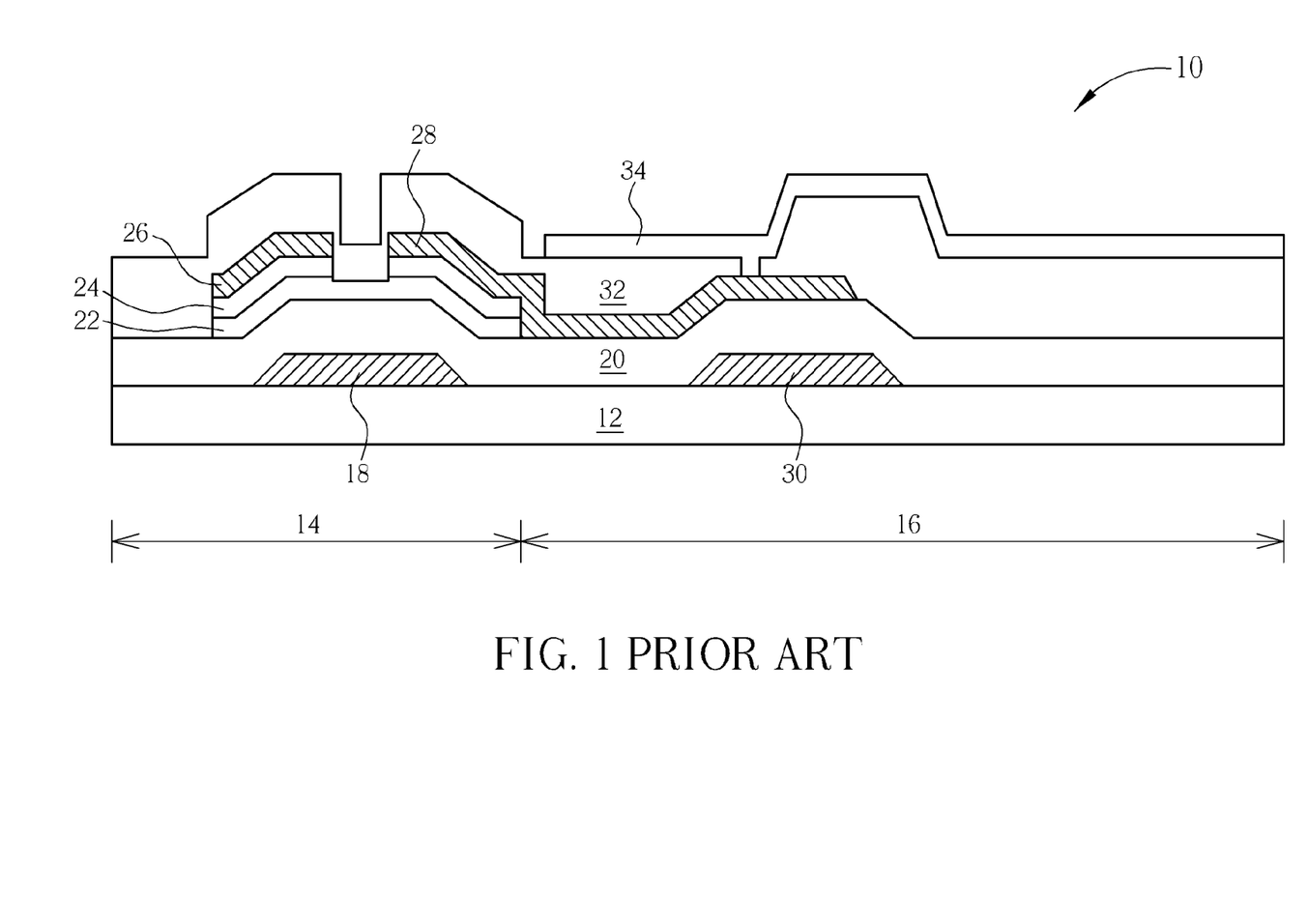
FIG. 1 is a schematic diagram illustrating a pixel structure of an LCD according to the prior art.

A pixel structure of a liquid crystal display (LCD) requires a storage capacitor, which could increase the storage capacitance so that electrical charges injected into the pixel electrode could be sustained until next scanning. Please refer to FIG. 1, which is a schematic diagram illustrating a pixel structure of an LCD according to the prior art. As shown in FIG. 1, the pixel structure 10 includes a substrate 12, and the substrate 12 has a thin film transistor (TFT) region 14 and a pixel region 16 defined thereon. A TFT is disposed in the TFT region 14, and includes a gate 18, a gate insulating layer 20, a semiconductor layer 22, a heavily doped semiconductor layer 24, a source 26, and a drain 28. A common electrode 30, a dielectric layer 32, and a pixel electrode 34 are disposed in the pixel region 16. The pixel electrode 34 and the drain electrode 28 are electrically connected to each other. The drain electrode 28 and the common electrode 30 partially overlap, and the overlapping part of the drain electrode 28 and the common electrode 30 forms a storage capacitor.

The storage capacitor of the conventional pixel structure 10 is formed by the overlapping part of two conductive layers including the drain electrode 28 and the common electrode 30. To increase the capacitance, the overlapping area of the drain electrode 28 and the common electrode 30 must increase, and this, however, would reduce the aperture ratio and influence display effect.

SUMMARY OF THE INVENTION

It is therefore an objective of the present invention to provide a pixel structure and method of fabricating the same to increasing the aperture ratio.

According to the present invention, a pixel structure is provided. The pixel structure includes a substrate, a gate, a patterned electrode, a first insulating layer, a common electrode, a second insulating layer, a semiconductor layer, a source and a drain, a passivation layer, and a pixel electrode. The gate is disposed on the substrate, and the patterned electrode is disposed on the substrate. The first insulating layer is disposed on the substrate, the gate, and the patterned electrode, and the first insulating layer has a first through hole exposing a part of the patterned electrode. The common electrode is disposed on the first insulating layer and disposed corresponding to the patterned electrode. The second insulating layer is disposed on the common electrode and the first insulating layer, and the second insulating layer has a second through hole disposed corresponding to the first through hole. The semiconductor layer is disposed on the second insulating layer and disposed corresponding to the gate. The source and the drain are disposed on the semiconductor layer and the second insulating layer and disposed corresponding to two sides of the gate respectively. The drain includes a first portion and a second portion, and the first portion of the drain is connected to the second portion of the drain. The first portion of the drain is electrically connected to the patterned electrode via the first through hole and the second through hole, and the second portion of the drain extends onto the common electrode, wherein the patterned electrode and the common electrode partially overlap and are coupled with each other to form a first storage capacitor, and the second portion of the drain and the common electrode partially overlap and are coupled with each other to form a second storage capacitor. The passivation layer is disposed on the second insulating layer, the semiconductor layer, the source and the drain, and the passivation layer has a third through hole exposing a part of the drain. The pixel electrode is disposed on the passivation layer, and the pixel electrode is electrically connected to the drain via the third through hole.

According to the present invention, a method of forming a pixel structure is provided. The method includes the following steps. First, a substrate is provided, and then, a gate and a patterned electrode are formed on the substrate. Next, a first insulating layer is formed on the gate, the patterned electrode and the substrate, and a common electrode is formed on the first insulating layer. Thereafter, a second insulating layer is formed on the first insulating layer and the common electrode, and a semiconductor channel layer is formed on the second insulating layer. Then, a second through hole is formed in the second insulating layer, and a first through hole is formed in the first insulating layer via the second through hole to expose a part of the patterned electrode. Next, a source and a drain are formed on the semiconductor channel layer and the second insulating layer, and the drain includes a first portion and a second portion. The first portion of the drain is connected to the second portion of the drain, and the first portion of the drain is electrically connected to the patterned electrode via the first through hole and the second through hole. The second portion of the drain extends onto the common electrode, wherein the patterned electrode and the common electrode partially overlap and are coupled with each other to form a first storage capacitor, and the second portion of the drain and the common electrode partially overlap and are coupled with each other to form a second storage capacitor. After that, a passivation layer is formed on the second insulating layer, the semiconductor channel layer, the source, and the drain. Subsequently, a third through hole is formed in the passivation layer to expose a part of the drain. Then, a pixel electrode is formed, and the pixel electrode is electrically connected to the drain via the third through hole.

The pixel structure of the present invention has the first storage capacitor and the second storage capacitor overlapping each other and being electrically connected in parallel. Accordingly, the pixel structure could largely increase capacitance of the storage capacitor without changing the aperture ratio of the pixel structure. Or, the areas of the patterned electrode, the common electrode and the second portion of the drain could be reduced to decrease the area covered by the first storage capacitor and the second storage capacitor, so that the aperture ratio of the pixel structure could be increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 2:
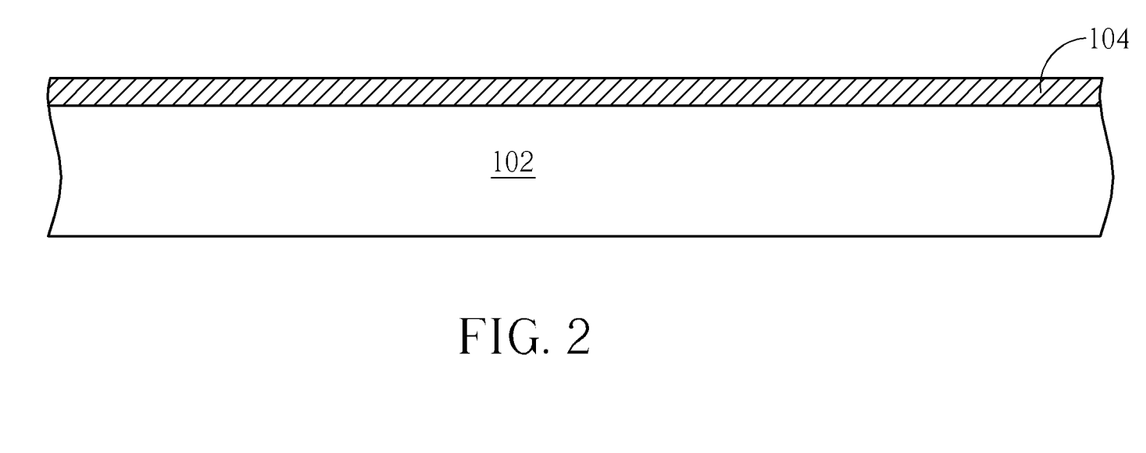
FIG. 2 through FIG. 10 are schematic diagrams illustrating a method of fabricating a pixel structure according to a preferred embodiment of the present invention.
Figure 3:
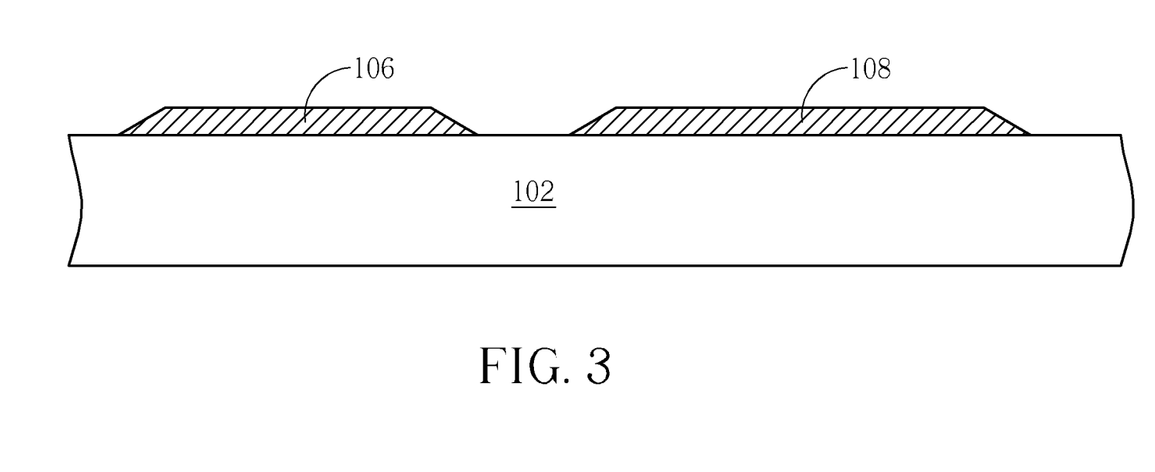

Please refer to FIG. 2 through FIG. 10, which are schematic diagrams illustrating a method of fabricating a pixel structure according to a preferred embodiment of the present invention. In the embodiments of the present invention, the pixel structure of an LCD panel is selected as examples to illustrate the application of the present invention, the pixel structure, however, may be used in various types of display panels. As shown in FIG. 2, a substrate 102 is first provided, such as glass substrate or flexible substrate, and then, a first metal layer 104 is formed on the substrate 102. Next, as shown in FIG. 3, a first photolithographic and etching process is performed to pattern the first metal layer 104 so as to form a scan line (not shown), a gate 106 and a patterned electrode 108 on the substrate 102. The gate 106 and the patterned electrode 108 in the present invention is not limited to be formed by the same metal layer or in the same etching process, and may be formed by etching different metal layers. Furthermore, a material of forming the patterned electrode is not limited to be metal, and may be other conductive materials.

Figure 4:
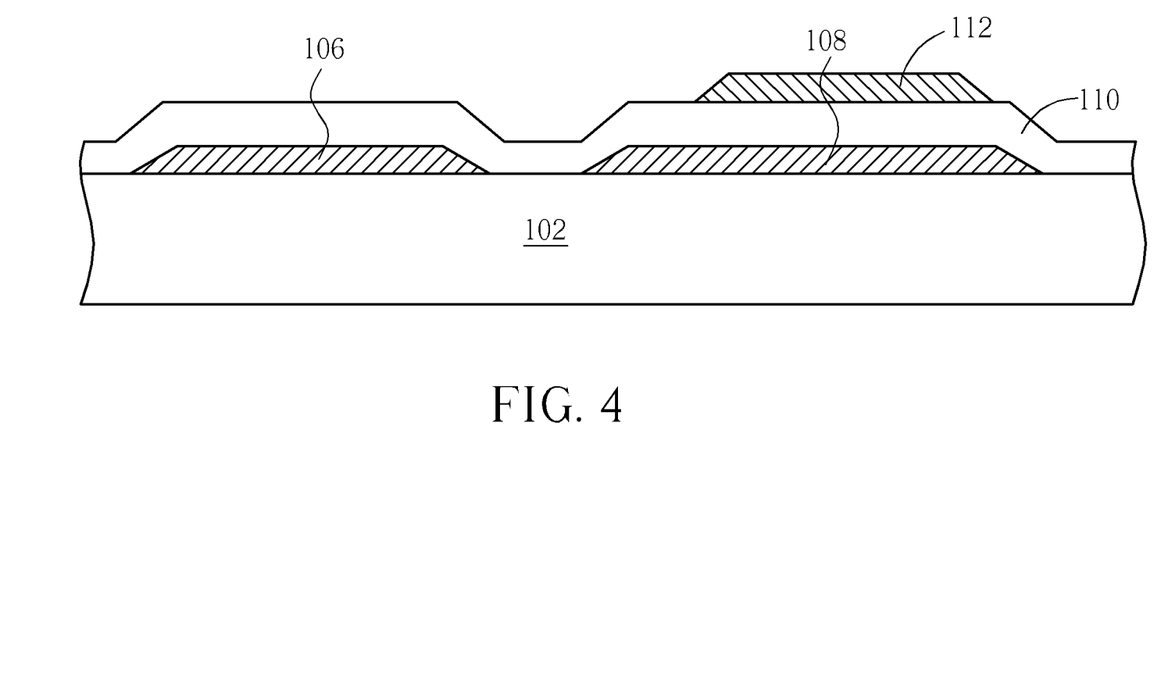

As shown in FIG. 4, next, a first insulating layer 110 is formed on the substrate 102, the gate 106 and the patterned electrode 108, and a second metal layer (not shown) is then formed on the first insulating layer 110. After that, a second photolithographic and etching process is performed to pattern the second metal layer so as to form a common electrode 112 on the first insulating layer 110. The common electrode 112 is disposed over the patterned electrode 108, and the common electrode 112 overlaps the patterned electrode 108, so that the common electrode 112 is coupled with the patterned electrode 108. A material of forming the common electrode 112 in the present invention is not limited to be metal, and also may be other conductive materials.

Figure 5:
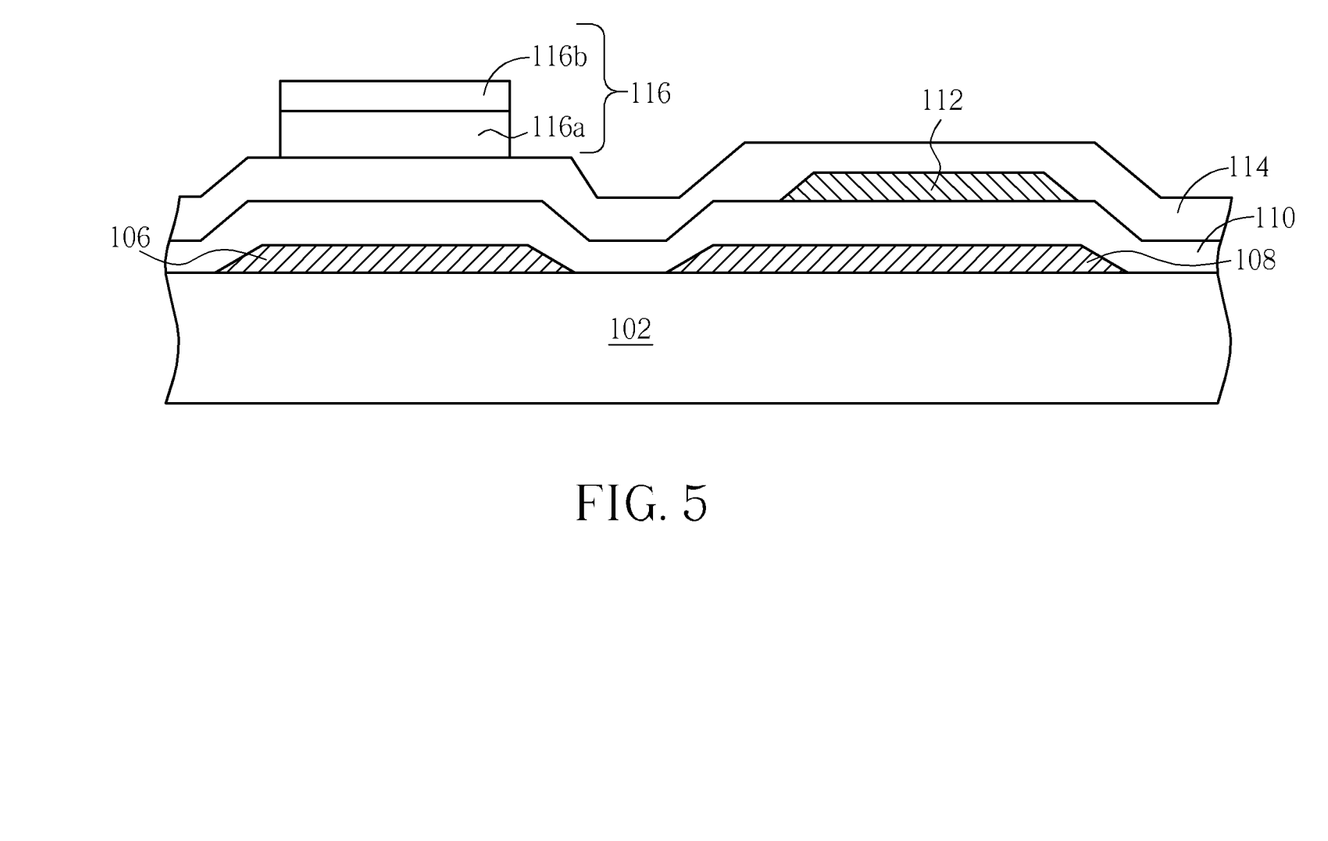

As shown in FIG. 5, a second insulating layer 114 and a semiconductor layer 116 are then formed on the first insulating layer 110 and the common electrode 112 sequentially. The semiconductor layer 116 includes a semiconductor channel layer 116a and a heavily doped semiconductor layer 116b. Next, a third photolithographic and etching process is performed to remove a part of semiconductor layer 116, and the remaining semiconductor layer 116 is disposed over the gate 106. In this embodiment, the semiconductor channel layer 116a includes a semiconductor material, such as polysilicon, and the heavily doped semiconductor layer 116b includes a material, such as doped polysilicon.

Figure 6:
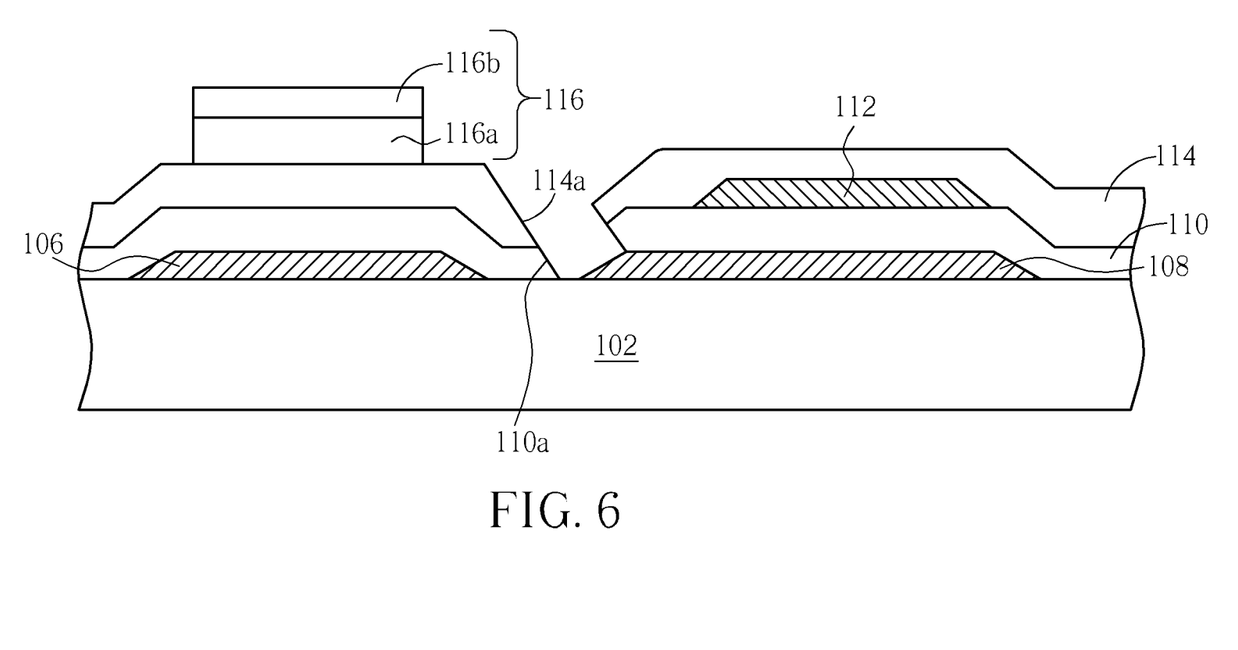

As shown in FIG. 6, a fourth photolithographic and etching process is then performed to etch the second insulating layer 114 to form a second through hole 114a in the second insulating layer 114. Thereafter, the etching process is continuously performed to etch the first insulating layer 110 via the second through hole 114a so as to form a first through hole 110a in the first insulating layer 110, and the first through hole 110a exposes a part of the patterned electrode 108. The first through hole 110a and the second through hole 114a are not limited to be formed in the same etching process, and may be formed by different etching processes performed sequentially.

Figure 7:
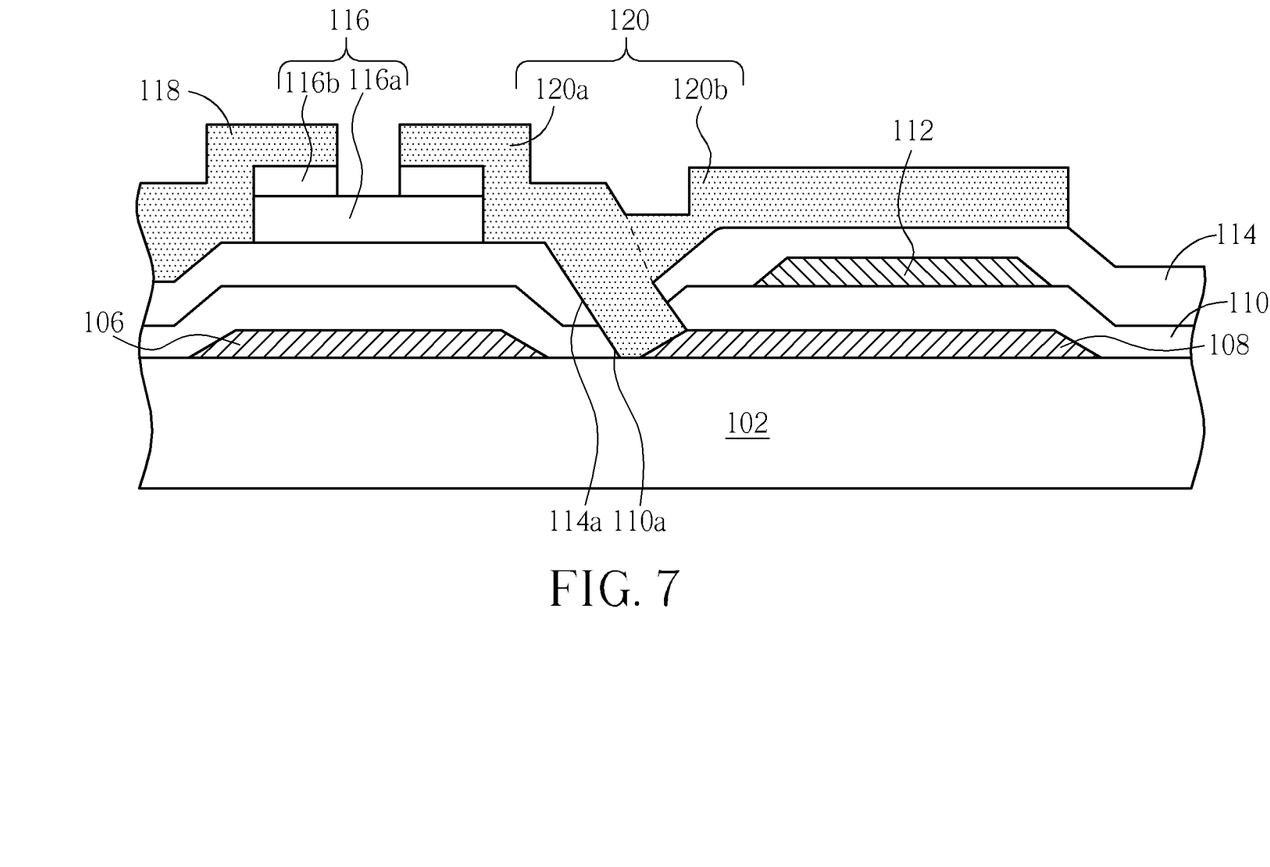

As shown in FIG. 7, a third metal layer (not shown) is then formed on the second insulating layer 114 and the semiconductor 116, and the third metal layer is filled into the first through hole 110a and the second through hole 114a. Next, a fifth photolithographic and etching process is performed to pattern the third metal layer so as to form a data line (not shown), a source 118 and a drain 120, and continuously, a part of the heavily doped semiconductor layer 116b and a part of the semiconductor channel layer 116a are removed. The source 118 and the drain 120 are respectively disposed on the semiconductor layer 116 and the second insulating layer 114 and respectively correspond to two sides of the gate 106. It should be noted that the drain 120 includes a first portion 120a and a second portion 120b, and the first portion 120a and the second portion 120b are connected to each other. The first portion 120a of the drain 120 is electrically connected to the patterned electrode 108 via the first through hole 110a and the second through hole 114a, and the second portion 120b of the drain 120 extends onto the common electrode 112, so that the second portion 120b of the drain 120 overlaps the common electrode 112, and is coupled with the common electrode 112.

Figure 8:
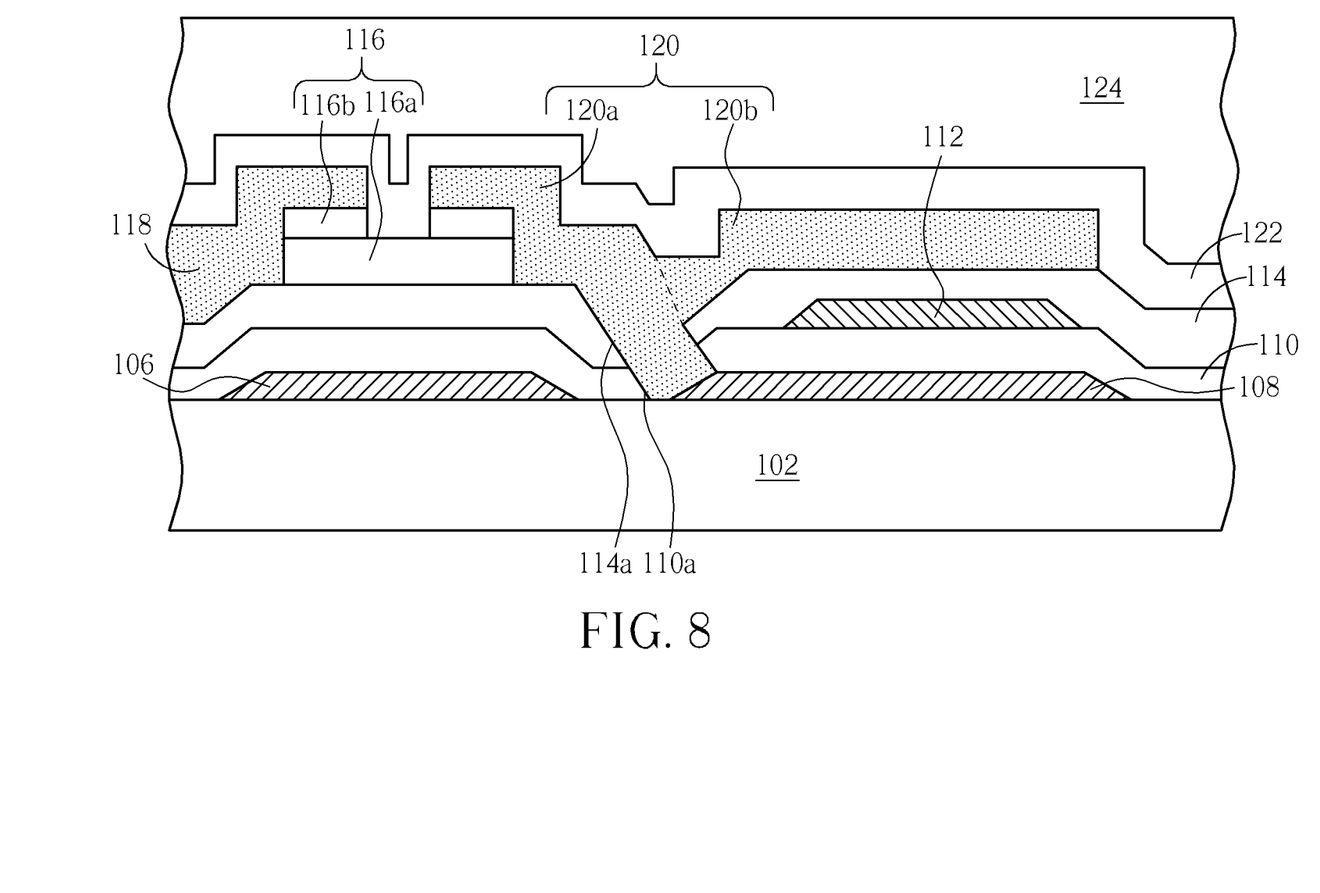
Figure 9:
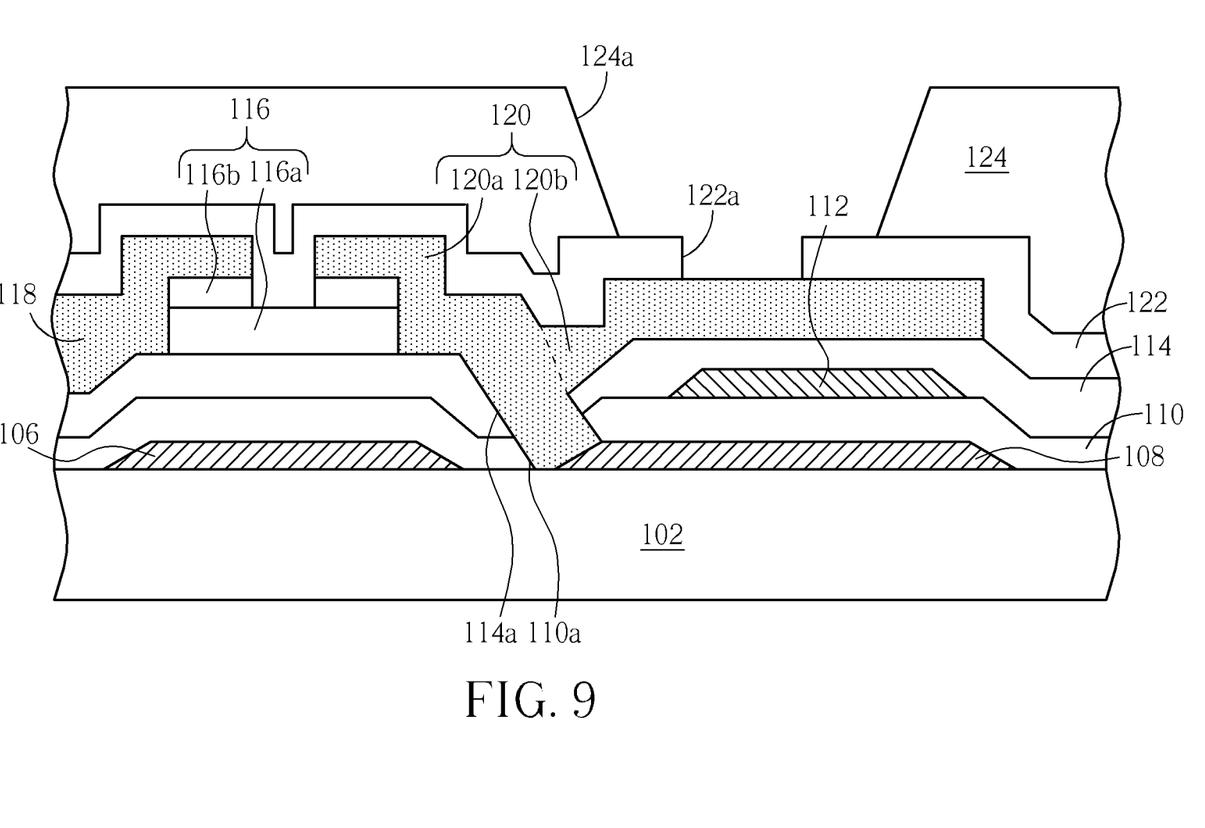

As shown in FIG. 8, a passivation layer 122 and an organic layer 124 are then formed sequentially on the second insulating layer 114, the semiconductor layer 116, the source 118 and the drain 120. The organic layer 124 covers the passivation layer 122, and is utilized to be a flat layer. In this embodiment, the passivation layer 122 is composed of an insulating material, such as silicon nitride, and the organic layer is composed of an organic material, such as photoresist material. After that, as shown in FIG. 9, a sixth photolithographic and etching process is performed to pattern the organic layer 124 so as to form a fourth through hole 124a in the organic layer 124. Then, a seventh photolithographic and etching process is performed to pattern the passivation layer 122 via the fourth through hole 124a so as to form a third through hole 122a in the passivation layer 122 and expose a part of the second portion 120b of the drain 120. The fourth through hole 124a is disposed corresponding to the third through hole 122a.

Figure 10:
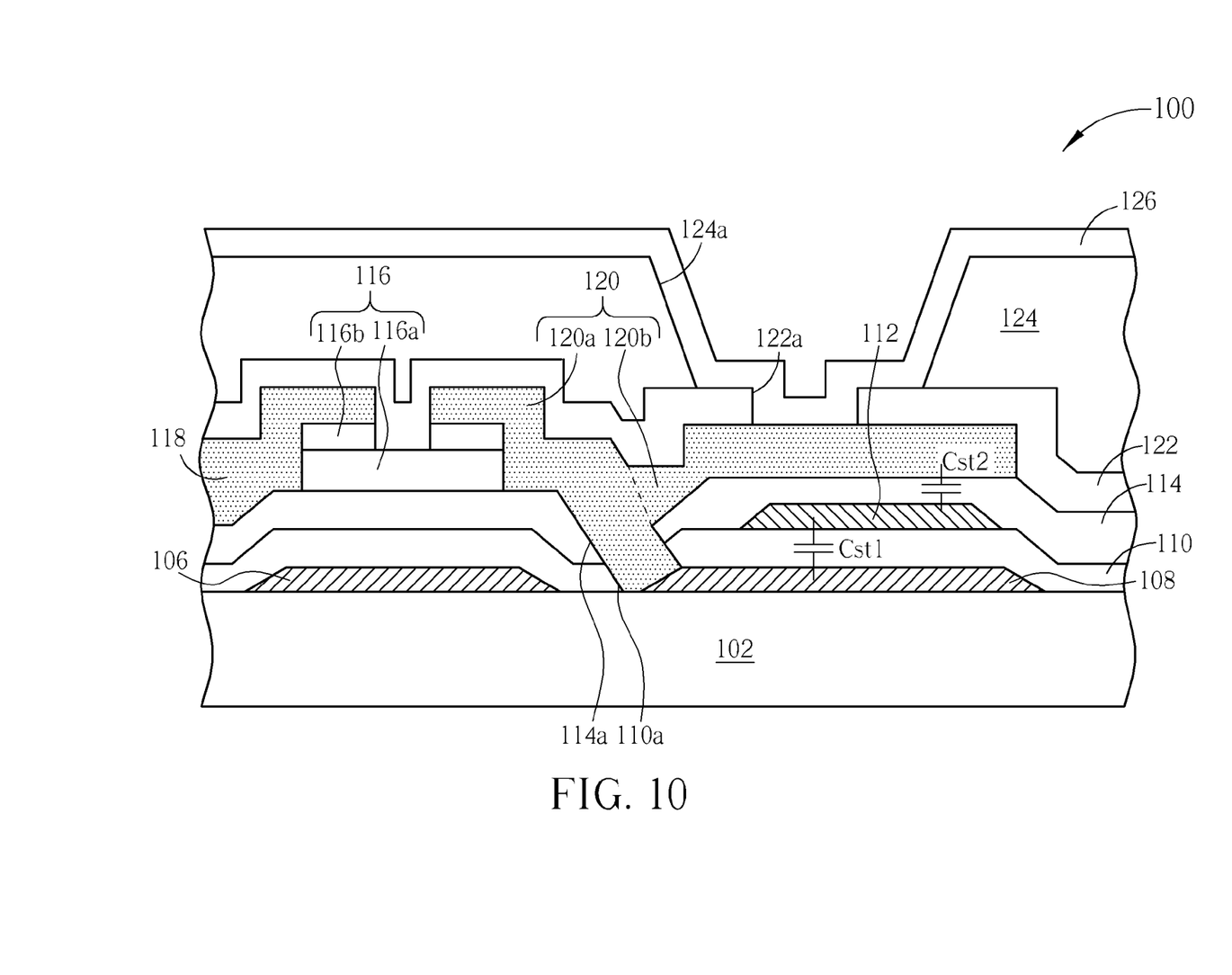

As shown in FIG. 10, finally, an eighth photolithographic and etching process is performed to form a pixel electrode 126 on the passivation layer 122, and the pixel electrode 126 is electrically connected to the second portion 120b of the drain 120 via the fourth through hole 124a and the third through hole 122a, and the pixel structure 100 in this embodiment is completed. As the above-mentioned description of this embodiment, the patterned electrode 108 is simultaneously formed in the step of forming the gate 106, and the first through hole 110a and the second through hole 114a are respectively formed in the first insulating layer 110 and the second insulating layer before forming the drain 120. Accordingly, when the drain 120 is formed in the following step, the drain 120 could be electrically connected to the patterned electrode 108. For this reason, the patterned electrode 108 could be electrically connected to the pixel electrode 126 via the second portion 120b of the drain 120, and the patterned electrode 108. The first insulating layer 110 and the common electrode 112 could form a first storage capacitor Cst1, and the second portion 120b of the drain 120, the second insulating layer 114 and the common electrode 112 form a second storage capacitor Cst2. In this embodiment, the pixel structure could therefore have the first storage capacitor Cst1 and the storage capacitor which overlap each other, and are electrically connected in parallel.

Figure 11:
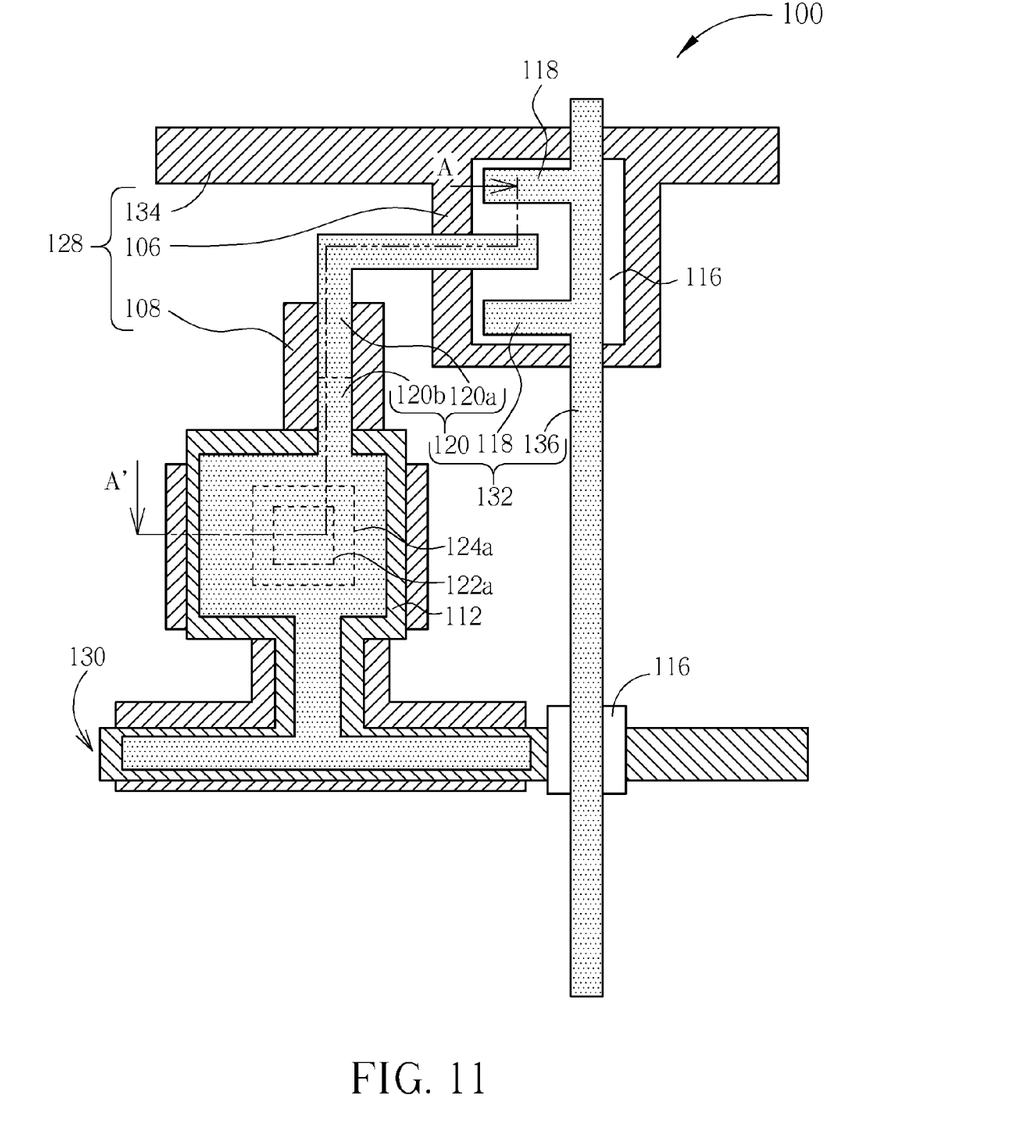
FIG. 11 is a schematic diagram illustrating a top view of the pixel structure according to the preferred embodiment of the present invention.

The pixel structure 100 in this embodiment would be detailed in the following description. Please refer to FIG. 11 together with FIG. 10. FIG. 11 is a schematic diagram illustrating a top view of the pixel structure according to the preferred embodiment of the present invention, and FIG. 10 is a schematic diagram illustrating a cross-sectional view taken along section line A-A' of FIG. 11. As shown in FIG. 10 and FIG. 11, in this embodiment, the pixel structure 100 includes the substrate 102, a first patterned conductive layer 128, the first insulating layer 110, a second patterned conductive layer 130, the second insulating layer 114, the semiconductor layer 116, a third patterned conductive layer 132, the passivation layer 122, the organic layer 124, and the pixel electrode 126. The first patterned conductive layer 128 is disposed on the substrate 102, and includes the gate 106, the scan line 134, and the patterned electrode 108, and the gate 106 is electrically connected to the scan line 134. The first insulating layer 110 covers the substrate 102 and the first patterned conductive layer 128, and the first insulating layer 110 has the first through hole 110a exposing a part of the patterned electrode 108. The second patterned conductive layer 130 is disposed on the first insulating layer 110, and includes the common electrode 112 disposed corresponding to the patterned electrode 108 and over the patterned electrode 108. The common electrode 112 is electrically connected to a common electrode layer disposed on a color filter substrate, and is used to transfer a common signal. The second insulating layer 114 covers the first insulating layer 110 and the second patterned conductive layer 130. The second insulating layer 114 has the second through hole 114a disposed corresponding to the first through hole 110a, and the part of the patterned electrode 108 exposed via the first through hole 110a could be exposed via the second through hole 114a. The semiconductor layer 116 is disposed on the second insulating layer 114, and is disposed over the gate 106 and corresponding to the gate 106. The third patterned conductive layer 132 is disposed on the semiconductor layer 116a and the second insulating layer 114, and includes the data line 136, the source 118, and the drain 120. The source 118 and the drain 120 are disposed corresponding to two sides of the gate 106. Furthermore, the semiconductor layer 116 includes the semiconductor channel layer 116a and the heavily doped semiconductor layer 116b, and the heavily doped semiconductor layer 116b is disposed between the semiconductor channel layer 116a and the source 118 and between the semiconductor channel layer 116a and the drain 120.

It should be noted that the drain 120 includes the first portion 120a and the second portion 120b, and the first portion 120a and the second portion 120b are connected to each other. The first portion 120a of the drain 120 extends from the top of the gate 106 to be in contact with the patterned electrode 106 via the first through hole 110a and the second through hole 114a so as to be electrically connected to the patterned electrode 108. The second portion 120b of the drain 120 extends from the top of the second through hole 114a onto the common electrode 112. Accordingly, the first storage capacitor Cst1 that is formed by the patterned electrode 108 and the common electrode being coupled with each other and the second storage capacitor Cst2 that is formed by the second portion 120b of the drain 120 and the common electrode being coupled with each other are electrically connected in parallel between the drain 120 and the patterned electrode 108. Furthermore, the second portion 120b of the drain 120 overlaps most parts of the common electrode 112 and the patterned electrode 108. As we could see from the above-mentioned description, the pixel structure 100 in this embodiment has the first storage capacitor Cst1 and the storage capacitor overlapping each other and being electrically connected in parallel. Thus, capacitance of the storage capacitor could be increased largely without changing the aperture ratio of the pixel structure 100. Or, areas of the patterned electrode 108, the common electrode 112 and the second portion 120b of the drain 120 could be reduced to decrease an area covered by the first storage capacitor Cst1 and the second storage capacitor Cst2, and the aperture ratio could be accordingly increased.

In addition, the passivation layer 122 and the organic layer 124 are sequentially disposed on the second insulating layer 114, the semiconductor layer 116, the source 118 and the drain 120. The passivation layer 122 has the third through hole 122a exposing a part of the second portion 120b of the drain 120, and the organic layer 124 has the fourth through 124a disposed corresponding to the third through hole 122a. The pixel electrode 126 is disposed on the organic layer 124, and is in contact with the second portion 120b of the drain 120 via the fourth through hole 124a and the third through hole 122a so as to electrically connect the drain 120. It should be noted that the pixel structure 100 in this embodiment disposes the organic layer 124 on the passivation layer 122 to increase a distance between the pixel electrode 126 and the data line 136, so that a crosstalk between the pixel electrode 126 and the data line 136 could be reduced.

In summary, the method of fabricating the pixel structure of the present invention forms the patterned electrode simultaneously in the step of forming the gate and forms the first through hole and the second through hole respectively in the first insulating layer and the second insulating layer before forming the drain, so that the drain formed in the following step could be electrically connected to the patterned electrode. Accordingly, the first storage capacitor and the second storage capacitor overlapping each other could be formed. For this reason, the pixel structure could largely increase capacitance of the storage capacitor without changing the aperture ratio of the pixel structure. Or, the areas of the patterned electrode, the common electrode and the second portion of the drain could be reduced to decrease the area covered by the first storage capacitor and the second storage capacitor, so that the aperture ratio of the pixel structure could be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a pixel structure, comprising:
providing a substrate;
forming a gate and a patterned electrode on the substrate;
forming a first insulating layer on the gate, the patterned electrode and the substrate, and forming a common electrode on the first insulating layer;
forming a second insulating layer on the first insulating layer and the common electrode, and forming a semiconductor channel layer on the second insulating layer;
forming a second through hole in the second insulating layer, and forming a first through hole in the first insulating layer via the second through hole to expose a part of the patterned electrode;
forming a source and a drain on the semiconductor channel layer and the second insulating layer, and the drain comprising a first portion and a second portion, the first portion of the drain being connected to the second portion of the drain, the first portion of the drain being electrically connected to the patterned electrode via the first through hole and the second through hole, the second portion of the drain extending onto the common electrode, wherein the patterned electrode and the common electrode partially overlap and are coupled with each other to form a first storage capacitor, and the second portion of the drain and the common electrode partially overlap and are coupled with each other to form a second storage capacitor;

forming a passivation layer on the second insulating layer, the semiconductor channel layer, the source, and the drain;

forming a third through hole in the passivation layer to expose a part of the drain; and forming a pixel electrode, and the pixel electrode being electrically connected to the drain via the third through hole.

2. The method of fabricating the pixel structure according to claim 1, wherein the step of forming the gate and the patterned electrode comprises:

forming a metal layer; and patterning the metal layer to form the gate and the patterned electrode.

3. The method of fabricating the pixel structure according to claim 1, wherein the step of forming the first through hole and the step of forming the second through are performed by a same etching process.

4. The method of fabricating the pixel structure according to claim 1, further comprising forming an organic layer on the passivation layer between the step of forming the passivation layer and the step of forming the third through hole.

5. The method of fabricating the pixel structure according to claim 4, further comprising forming a fourth through hole in the organic layer corresponding to the third through hole between the step of forming the organic layer and the step of forming the third through hole.

6. The method of fabricating the pixel structure according to claim 1, wherein a material of forming the common electrode is metal.

7. The method of fabricating the pixel structure according to claim 1, further comprising forming a heavily doped semiconductor layer on the semiconductor channel layer.

* * * * *